(12) United States Patent
Balimann et al.

(10) Patent No.: US 10,718,923 B2
(45) Date of Patent: Jul. 21, 2020

(54) THERMALLY TUNABLE OPTOELECTRONIC MODULES

(71) Applicant: AMS SENSORS SINGAPORE PTE. LTD., Singapore (SG)

(72) Inventors: Martin Lukas Balimann, Zürich (CH); James Eilertsen, Pittsford, NY (US)

(73) Assignee: ams Sensors Singapore Pte. Ltd., Singapore (SG)

( * ) Notice: Subject to any disclaimer, the term of this patent is extended or adjusted under 35 U.S.C. 154(b) by 151 days.

(21) Appl. No.: 15/805,213

(22) Filed: Nov. 7, 2017

(65) Prior Publication Data
US 2018/0129013 A1    May 10, 2018

Related U.S. Application Data

(60) Provisional application No. 62/420,038, filed on Nov. 10, 2016.

(51) Int. Cl.
| | |
|---|---|
| *G02B 7/02* | (2006.01) |
| *G02B 19/00* | (2006.01) |
| *G02B 26/00* | (2006.01) |
| *G02B 1/02* | (2006.01) |
| *H01S 5/183* | (2006.01) |
| *H01S 5/022* | (2006.01) |

(Continued)

(52) U.S. Cl.
CPC .............. *G02B 7/028* (2013.01); *G02B 1/02* (2013.01); *G02B 19/0009* (2013.01); *G02B 19/0014* (2013.01); *G02B 19/0057* (2013.01); *G02B 26/007* (2013.01); *H01S 5/18386* (2013.01); *H01S 5/0228* (2013.01); *H01S 5/02244* (2013.01); *H01S 5/02296* (2013.01); *H01S 5/02469* (2013.01); *H01S 5/183* (2013.01); *H01S 5/423* (2013.01)

(58) Field of Classification Search
CPC ................ G02B 7/028; G02B 19/0014; G02B 19/0057; G02B 1/02; G02B 26/007; G02B 19/0009; G02B 7/008; H01S 5/18386; H01S 5/0228; H01S 5/423; H01S 5/02296; H01S 5/02469; H01S 5/183; H01S 5/02244; G06T 7/521
See application file for complete search history.

(56) References Cited

U.S. PATENT DOCUMENTS 5,410,563 A * 4/1995 Nakamura .............. B41J 2/471
                                                                    372/101
9,273,846 B1    3/2016 Rossi et al.
(Continued)

*Primary Examiner* — Kimberly N. Kakalec
(74) *Attorney, Agent, or Firm* — Michael Best & Friedrich LLP

(57) ABSTRACT

A thermally tunable optoelectronic module includes a light emitting assembly operable to emit light of a particular wavelength or range of wavelengths. The light emitting assembly is disposed to a temperature-dependent wavelength shift. The thermally tunable optoelectronic module further includes an optical assembly aligned to the light emitting assembly, and separated from the light emitting assembly by an alignment distance. The thermally tunable optoelectronic module further includes a thermally tunable spacer disposed between the optical assembly and the light-emitting assembly, the thermally tunable spacer is operable to counteract the temperature-dependent wavelength shift.

14 Claims, 2 Drawing Sheets

(51) Int. Cl.
*H01S 5/024* (2006.01)
*H01S 5/42* (2006.01)

(56) References Cited

U.S. PATENT DOCUMENTS

| | | | | |
|---|---|---|---|---|
| 2004/0070833 | A1* | 4/2004 | Sargent | G02B 5/281 359/577 |
| 2010/0171813 | A1* | 7/2010 | Pelman | G01S 17/89 348/46 |
| 2013/0038941 | A1* | 2/2013 | Pesach | G01B 11/25 359/619 |
| 2014/0192424 | A1* | 7/2014 | Matsui | G02B 13/003 359/717 |
| 2014/0376092 | A1* | 12/2014 | Mor | G01B 11/2513 359/569 |
| 2015/0355470 | A1* | 12/2015 | Herschbach | G02B 27/0977 362/11 |

* cited by examiner

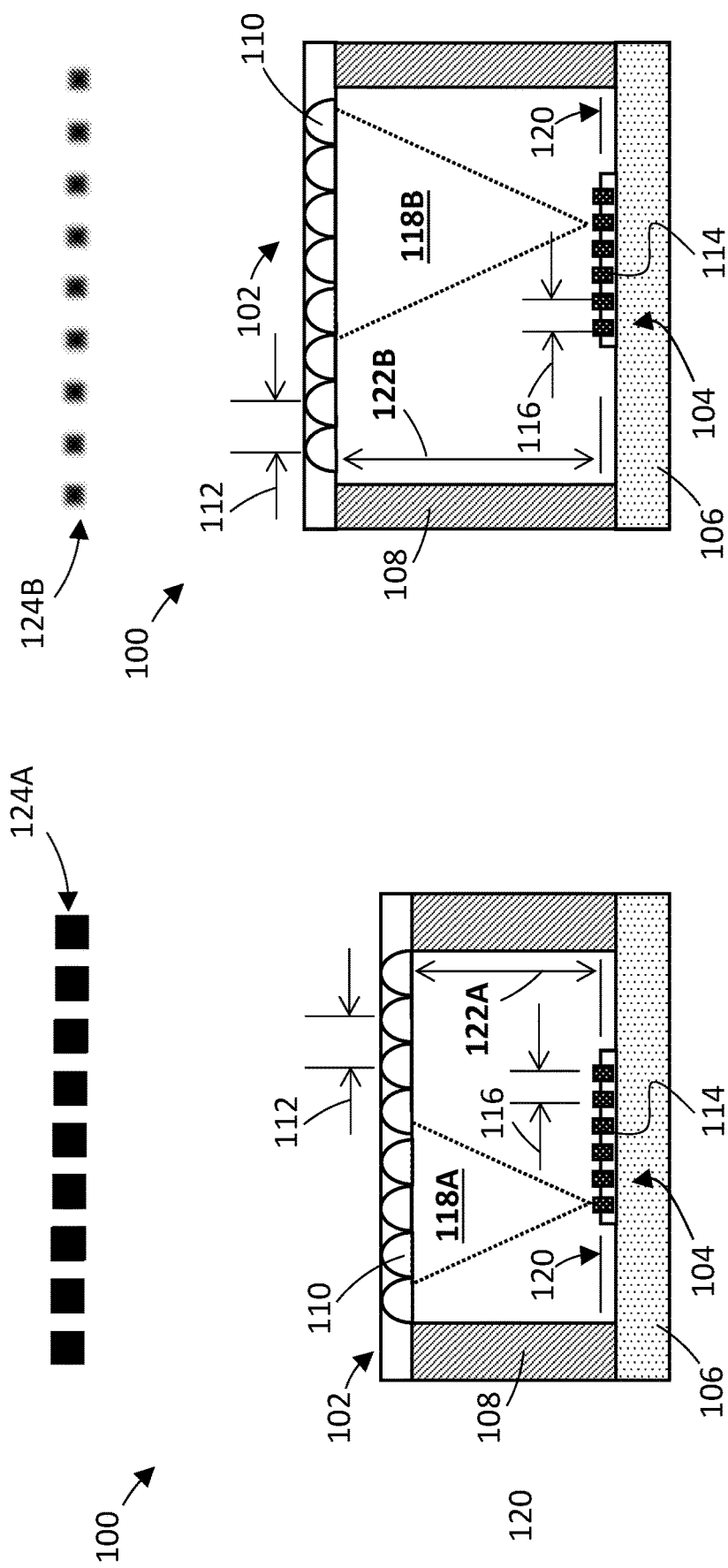

THERMALLY TUNABLE OPTOELECTRONIC MODULES

FIELD OF THE DISCLOSURE

The present disclosure relates to thermally tunable optoelectronic modules.

BACKGROUND

An example of a typical light-emitting optoelectronic module may include a light-emitting assembly aligned with an optical assembly or series of optical assemblies. The light-emitting element may include a high-power laser diode or an array of high-power laser diodes operable to generate light of a particular wavelength or wavelengths. The optical assembly may include a refractive or diffractive lens, arrays or series of refractive and/or diffractive lenses, a microlens array or a series of microlens arrays operable to direct light of the particular wavelength or range of wavelengths. Together the light-emitting assembly and the optical assembly may be operable to generate (e.g., project) a light pattern of high-contrast features over a range of operating temperatures. During normal operation, the module's operating temperature may fluctuate, thereby causing the optical assembly and light-emitting assembly to become misaligned. Temperature fluctuations also may alter characteristics of the light-emitting assembly, such as the wavelength of light it generates. Both effects may strongly degrade optical performance during typical operation, therefore limiting the effectiveness or potential applications of such light-emitting optoelectronic modules to narrow operating temperatures.

For instance, a light-emitting optoelectronic module that includes a refractive lens with a focal length, and a vertical-cavity surface-emitting laser (VCSEL) array with an emission plane may be susceptible to such degradation in optical performance during typical operation. In this instance, the refractive lens should be aligned to the VCSEL array when the focal length is incident on the emission plane. Hence, the refractive lens and the VCSEL array can be aligned and mounted to a spacer. The spacer may be composed of a material having a positive thermal expansion coefficient. Typically, during operation, the VCSEL array generates a sufficiently high level of heat so to cause the spacer to expand. The expansion can cause the refractive lens and VCSEL array to become misaligned (i.e., the focal length of the refractive lens is no longer incident on the emission plane of the VCSEL array) at some operating temperatures. In some instances, this misalignment significantly degrades the optical performance of the light-emitting optoelectronic module at some operating temperatures.

In another instance, a light-emitting optoelectronic module includes a diffractive lens, such as a Fresnel-like diffractive lens or other diffractive optical assembly, and a VCSEL array arranged to emit a particular wavelength. The diffractive lens is specifically designed for the specific wavelength emitted by the VCSEL array. However, during operation, the VCSEL array generates sufficiently high level of heat so to shift the light emitted by the VCSEL array to longer wavelengths (e.g., 0.3 nm K$^{-1}$). In some cases, such VCSEL arrays heat up to 80 K or even 100 K above the temperature for which the light-emitting optoelectronic module specifically was designed, thereby causing significant shifts to longer wavelengths and a concurrent degradation in optical performance of the light-emitting optoelectronic module.

In some instances, a light-emitting optoelectronic module includes a microlens array and a VCSEL array. The optical performance of such light-emitting optoelectronic modules is strongly dependent on the alignment of the microlens array and the VCSEL array, as well as the wavelength of light emitted by the VCSEL array. However, as described above, significant fluctuations in operating temperature can cause the microlens array and the VCSEL array to become misaligned due to fluctuations in material dimensions, and further can cause a shift in wavelengths emitted by the VCSEL array.

SUMMARY

The present disclosure describes thermally tunable optoelectronic modules that, in some cases, are capable of mitigating or completely negating optical performance degradation due to fluctuations in operating temperature.

For example, in one aspect, a thermally tunable optoelectronic module includes a light emitting assembly. The light emitting assembly is operable to emit light of a particular wavelength or range of wavelengths. The light emitting assembly is disposed to a temperature-dependent wavelength shift. The thermally tunable optoelectronic module further includes an optical assembly aligned to the light emitting assembly. The optical assembly is separated from the light emitting assembly by an alignment distance. The thermally tunable optoelectronic module further includes a thermally tunable spacer disposed between the optical assembly and the light-emitting assembly. The thermally tunable spacer is operable to counteract the temperature-dependent wavelength shift.

Some implementations include one or more of the following features. For example, the thermally tunable optoelectronic module can include an optical assembly with an array of microlenses. The microlenses can be disposed with respect to each other by a microlens array pitch. The light-emitting assembly can include an array of light-emitting elements, where the light-emitting elements are disposed with respect to each other by a light-emitting element array pitch.

In some instances, the thermally tunable optoelectronic module includes an alignment distance substantially equal to a non-zero whole number integer divided by two. The dividend is multiplied by the square of the microlens array pitch divided by the particular wavelength or range of wavelengths emitted by the light emitting assembly.

In some cases, the thermally tunable optoelectronic module includes an alignment distance substantially equal to a non-zero whole number integer divided by two. The dividend is multiplied by the square of the light-emitting element array pitch divided by the particular wavelength or range of wavelengths emitted by the light emitting assembly.

In some implementations, the thermally tunable optoelectronic module includes a light emitting element that includes a laser diode.

In some instances, the thermally tunable optoelectronic module includes a thermally tunable spacer that exhibits negative thermal expansion along the alignment distance.

In some case, the thermally tunable optoelectronic module includes a light-emitting element that generates a particular wavelength or range of wavelengths that correspond to the infrared portion of the electromagnetic spectrum.

In some implementations, the thermally tunable optoelectronic module includes a laser diode that is a vertical-cavity surface-emitting laser.

In some cases, the thermally tunable optoelectronic module includes a heat sink.

In some instances, the thermally tunable optoelectronic module includes a lead frame.

In some implementations, the thermally tunable optoelectronic module includes a light-emitting assembly mounted to a printed circuit board.

In some cases, the thermally tunable optoelectronic module includes a thermally tunable spacer at least partially composed of a material having a negative thermal expansion coefficient.

In some instances, the thermally tunable optoelectronic module includes a liquid crystal polymer.

In another example aspect a thermally tunable optoelectronic module includes a liquid crystal polymer with an orientation direction and a cross flow direction. The cross flow direction is substantially aligned with an alignment distance.

In some implementations, the thermally tunable optoelectronic module includes an inorganic oxide material with a negative thermal expansion coefficient.

In some instances, the thermally tunable optoelectronic module includes at least one of: $ZrW_2O_8$, $HfW_2O_8$, $ZrMo_2O_8$, $HfMo_2O_8$, $ZrV_2O_7.Zr_2(MoO_4)_3$, $ZrV_2O_7.Hf_2(MoO_4)_3$, $ZrV_2O_7.Zr_2(WO_4)_3$, $ZrV_2O_7.Hf_2(WO_4)_3$, or $CuScO_2$.

Other aspects, features and advantages will be readily apparent from the following detailed description, the accompanying drawing and the claims.

BRIEF DESCRIPTION OF THE DRAWINGS

FIG. 1A depicts an example light-emitting optoelectronic module operating at a first operating temperature.

FIG. 1B depicts the example light-emitting optoelectronic module depicted in FIG. 1A operating at a second operating temperature.

DETAILED DESCRIPTION

Figures 2A, 2B:
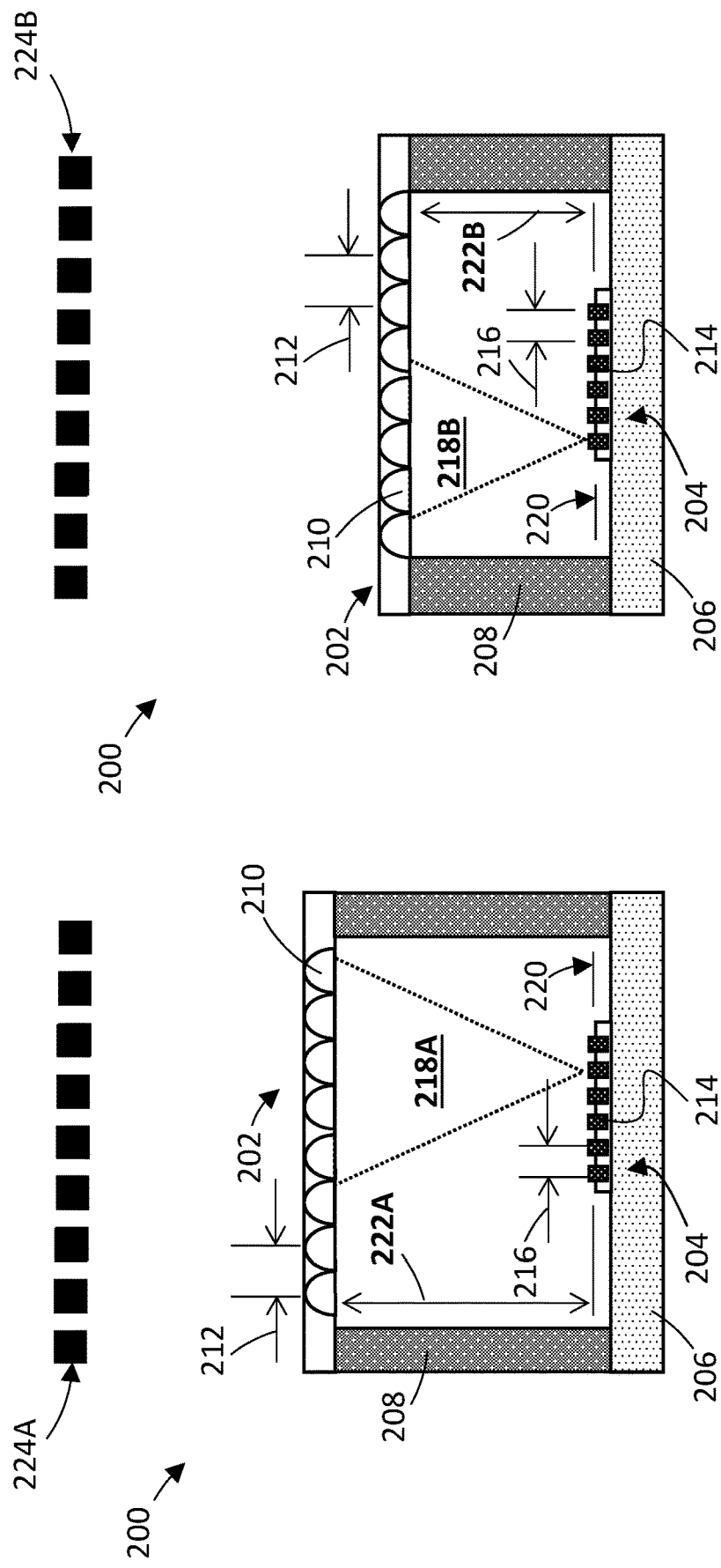
FIG. 2A depicts an example thermally tunable light-emitting optoelectronic module operating at a first operating temperature.
FIG. 2B depicts the example thermally tunable light-emitting optoelectronic module depicted in FIG. 2A operating at a second operating temperature.

FIG. 1A depicts a light-emitting optoelectronic module 100 such as the light-emitting optoelectronic modules disclosed in U.S. Pat. No. 9,273,846 B1, which is incorporated herein by reference in its entirety. FIG. 1A depicts the light-emitting optoelectronic module 100 operating at a first operating temperature. The light-emitting optoelectronic module 100 includes an optical assembly 102, a light-emitting assembly 104, a substrate 106, and a spacer 108. In this example, the optical assembly 102 is a microlens array including an array of microlenses 110 disposed with respect to each other by a microlens array pitch 112. The microlens array pitch 112 can be in the range, e.g., of 20 μm to 100 μm, for example 50 μm. Other pitches can be used in some implementations. In the illustrated example, the light-emitting assembly 104 is an array of light-emitting elements 114 (e.g., VCSEL array including an array of VCSEL diodes) disposed with respect to each other by a light-emitting element array pitch 116. The light-emitting element array pitch 116 can be in the range, e.g., of 20 μm to 100 μm, for example 50 μm. Other pitches can be used in some implementations. The light-emitting assembly 104 is operable to emit light 118A of a particular wavelength from a common emission plane 120. The light-emitting assembly 104 can emit light 118A of any wavelength; for example, 850 nm or 940 nm. The optical assembly 102 is aligned with the emission plane 120; that is, the optical assembly 102 is separated from the emission plane 120 by an alignment distance 122A. The alignment distance 122A can be in the range, e.g., of 1.5 mm to 6 mm, for example 2.94 mm. The light-emitting assembly 104 is mounted (e.g., electrically and/or mechanically mounted) to the substrate 106. The substrate 106 can be a printed circuit board, for example. The optical assembly 102 is separated from the light-emitting assembly 104 by the spacer 108 thereby establishing the alignment distance 122A between the optical assembly 102 and the emission plane 120. The spacer 108 can be composed of a polymeric material such as an epoxy resin. Light 118A emitted from the light-emitting assembly 104 is incident on the optical assembly 102, wherein a pattern 124A of high contrast features is produced in the far field at a first operating temperature.

In some instances, the microlens array pitch 112 and the light-emitting element array pitch 116 are different from one another. In other instances, the microlens array pitch 112 and the light-emitting element array pitch 116 are substantially equal, as depicted in FIG. 1A, wherein the microlens array pitch 112, the light-emitting element array pitch 116, the particular wavelength of the light 118A is selected and the alignment distance 122A is arranged according to the following, Eq. 1:

$$Z = (P)^2/\lambda \qquad \text{Eq. 1}$$

where the microlens array pitch 112 and the light-emitting element array pitch 116 are equal and are represented by P, the particular wavelength of light 118A is represented by λ, and the alignment distance 122A is represented by Z. For example, when the microlens array pitch 112 is 50 μm, the light-emitting element array pitch 116 is 50 μm, and the light-emitting assembly 104 emits light 118A of 850 nm, the alignment distance 122A is 2.94 mm. As disclosed in U.S. Pat. No. 9,273,846 B1, such an arrangement of microlens array pitch 112, light-emitting element array pitch 116, wavelength of light 118A, and alignment distance 122A can produce the pattern 124A of particularly high-contrast features is the far field at the first operating temperature.

FIG. 1B depicts the example light-emitting optoelectronic module 100 illustrated in FIG. 1A operating at a second operating temperature greater than the first operating temperature. In this example, both the light 118A and the alignment distance 122A are affected by the change in temperature. The light 118A produced by the light emitting element shifts to longer wavelengths. In some instances, the wavelength increases by 0.3 nm $K^{-1}$ increase in temperature. For example, for a 100 K increase in temperature, a 30.0 nm increase in wavelength can occur.

However, in order to satisfy the relationship given in Eq. 1 at the longer wavelengths and maintain optical performance, the alignment distance 122A and/or the pitches 112, 116 must be modified. Thus, an increase in wavelength would necessitate a contraction in the alignment distance 122A to maintain the same optical performance. For example, given a light-emitting optoelectronic module 100 with a microlens array pitch 112 of 50 μm, a light-emitting element array pitch 116 of 50 μm, light 118A of 850 nm, and an alignment distance 122A of 2.94 mm, an increase in wavelength of 30.0 nm would require a contraction of the alignment distance 122A of 100 μm to yield a pattern 124A with the same high-contrast features. Generally, for such optoelectronic modules designed for the first operating temperature, the contrast of the pattern 124A will be lower at the second operating temperature as depicted by pattern 124B in FIG. 1B.

Moreover, as the spacer 108 is composed of a material having a positive thermal expansion coefficient, the alignment distance 122 B will be larger at the second operating temperature as depicted by alignment distance 122B in FIG. 1B. If, for example, the spacer 108 is composed of cast epoxy resin with a linear thermal expansion coefficient of $45 \times 10^{-6} \text{ K}^{-1}$, an increase in operating temperature of 100 K, and a spacer 108 length equal to the alignment distance 122A of 2.94 mm, the spacer 108 may increase in length as much as 13.2 μm. Such an increase may severely degrade optical performance of the light-emitting optoelectronic module 200.

FIG. 2A depicts a thermally tunable light-emitting optoelectronic module 200 operating at a first operating temperature. The thermally tunable light-emitting optoelectronic module 200 includes an optical assembly 202, a light-emitting assembly 204, and a substrate 206 as disclosed for the example optoelectronic module 100 depicted in FIGS. 1A and 1B. The light-emitting optoelectronic module 200 depicted in FIG. 2A further includes a thermally tunable spacer 208 composed (at least in part) of a negative thermal expansion material; for example, a liquid crystal polymer, $ZrW_2O_8$, $Sc(WO_4)_3$, $HfW_2O_8$, $ZrMo_2O_8$, $HfMo_2O_8$, $ZrV_2O_7.Zr_2(MoO_4)_3$, $ZrV_2O_7.Hf_2(MoO_4)_3$, $ZrV_2O_7.Zr_2(WO_4)_3$, $ZrV_2O_7.Hf_2(WO_4)_3$, or $CuScO_2$. In some instances, the linear coefficient of thermal expansion of such materials can range from $-9.1 \times 10^{-6} \text{ K}^{-1}$ for $ZrW_2O_8$ to $-2.2 \times 10^{-6} \text{ K}^{-1}$ for $Sc(WO_4)_3$ (as reported by J. S. O. Evans in the Journal of the Chemical Society Dalton Transactions, 1999, 3317).

The light-emitting optoelectronic module 200 further includes an array of microlenses 210 disposed with respect to each other at a microlens array pitch 212. In this example, the light-emitting assembly 204 is a VCSEL array that includes an array of VCSEL diodes 214 disposed with respect to each other at a light-emitting element array pitch 216. The light-emitting assembly 204 is operable to emit light 218A of a particular wavelength from a common emission plane 220. The optical assembly 202 is aligned with the emission plane 220; that is, the optical assembly 202 is separated from the emission plane 220 by an alignment distance 222A. The light-emitting assembly 204 is mounted (e.g., electrically and/or mechanically mounted) to the substrate 206. The substrate 206 is a printed circuit board in this example. The optical assembly 202 can be disposed from the light-emitting assembly 204 by the thermally tunable spacer 208 thereby establishing the alignment distance 222A between the optical assembly 202 and the emission plane 220. Light 218A emitted from the light-emitting assembly 204 is incident on the optical assembly 202, wherein a pattern 224A of high contrast features is produced in the far field at a first operating temperature.

In some instances, the microlens array pitch 212 and the light-emitting element array pitch 216 are different from one another. In other instances, the microlens array pitch 212 and the light-emitting element array pitch 216 are substantially equal, as depicted in FIG. 2A, wherein the microlens array pitch 212, the light-emitting element array pitch 216, the particular wavelength of the light 218A, and the alignment distance 222A are arranged according to Eq. 1. In this example, the microlens array pitch 212 and the light-emitting element array pitch 216 are equal and, therefore, are both represented by P, the particular wavelength of light 218A is represented by λ, and the alignment distance 222A is represented by Z. As disclosed above, such an arrangement of microlens array pitch 212, light-emitting element array pitch 216, wavelength of light 218A, and alignment distance 222A produces the pattern 224A of particularly high-contrast features in the far field at the first operating temperature.

FIG. 2B depicts the example light-emitting optoelectronic module 200 illustrated in FIG. 2A operating at a second operating temperature greater than the first operating temperature. The light 218A and the alignment distance 222A are affected by the change in temperature. The light 218A produced by the light emitting element shifts to longer wavelengths 218B as described above deviating from the relationship described by Eq. 1. However, as the thermally tunable spacer 208 is composed at least in part of a negative thermal expansion material, the alignment distance 222B is smaller (rather than larger as in FIG. 1B) at the second, in this case, higher operating temperature. Accordingly, the aforementioned shift to longer wavelengths is counteracted, at least in part, by the smaller alignment distance 222B as the wavelength 218B and the alignment distance 222B together substantially satisfy the relationship described by Eq. 1. Consequently, the optical performance of the thermally tunable light-emitting optoelectronic module 200 will not significantly degrade, i.e., the pattern 224B will have similar contrast as the pattern 224A depicted in FIG. 2A.

In some implementations, the thermally tunable spacer 208 is formed from a composite composed of a particular ratio of constituent materials, where the composite is formulated to counteract the wavelength shift described above. For example, the thermally tunable spacer 208 can be formed from a composite composed of two materials each with a different thermal expansion coefficient. The proportion of the two materials within the composite can be determined by a simple rule of mixtures such that the net thermal expansion coefficient of the composite is substantially similar to the wavelength shift described above.

For example, in some cases, the thermally tunable light-emitting optoelectronic module 200 described above is arranged according to Eq. 1, where: P=50 μm, λ=−850 nm, Z=2.94 mm, and wavelength shift=0.3 nm $K^{-1}$. Further, according to Eq. 1, a 100 K increase would cause a deviation of Z in Eq. 1 by 100 μm. Consequently, the thermally tunable spacer 208 contracts by 100 μm in order to maintain the same optical performance, which can be expressed as a target coefficient of thermal expansion: $(\Delta T) \times (\Delta Z)/Z = 340 \times 10^{-6} \text{ K}^{-1}$ in this example. A composite composed of $ZrW_2O_8$ and cast epoxy resin with thermal expansion coefficients of $-9.1 \times 10^{-6} \text{ K}^{-1}$ and $45 \times 10^{-6} \text{ K}^{-1}$, respectively, could be formulated according to the following: $(-9.1 \times 10^{-6} \text{ K}^{-1})(X) + (45 \times 10^{-6} \text{ K}^{-1})(Y) = 340 \times 10^{-6} \text{ K}^1$ where X and Y are the fraction $ZrW_2O_8$ of and the cast epoxy resin, respectively.

Further, although the alignment distance 222A, 222B, the wavelength of the emitted light 218A, 218B, the microlens array pitch 212, and the light-emitting element array pitch 216 are arranged according to Eq. 1. Other arrangements are within the scope of this disclosure. For example, the alignment distance 222A, 222B, the wavelength of the emitted light 218A, 218B, the microlens array pitch 212, and the light-emitting element array pitch 216 is arranged according to Eq. 2 where:

$$Z = (n/2)(P)^2/\lambda \qquad \text{Eq. 2}$$

where n is a non-zero whole integer, the microlens array pitch 212 and the light-emitting element array pitch 216 are equal and are represented by P, the particular wavelength of light 218A, 218B is represented by λ, and the alignment distance 222A, 222B is represented by Z. As disclosed in U.S. Pat. No. 9,273,846 B1, such an arrangement of microlens array pitch 212, light-emitting element array pitch 216, wavelength of light 218A, 218B and alignment distance 222A, 224B can produce the pattern 224A, 224B of particularly high-contrast features is the far field at a range of operating temperatures.

The foregoing description describes example implementations. Various modifications, however, can be made within the spirit of the disclosure. Accordingly, other implementations are within the scope of the claims.

What is claimed is:

1. A thermally tunable optoelectronic module comprising:
   a light emitting assembly operable to emit light of a particular wavelength or range of wavelengths, the light emitting assembly being disposed to a temperature-dependent wavelength shift;
   an optical assembly aligned to the light emitting assembly, the optical assembly being separated from the light emitting assembly by an alignment distance; and
   a thermally tunable spacer disposed between the optical assembly and the light-emitting assembly, the thermally tunable spacer being operable to counteract the temperature-dependent wavelength shift, wherein the thermally tunable spacer exhibits negative thermal expansion along the alignment distance.

2. The optoelectronic module of claim 1, wherein the optical assembly includes an array of microlenses disposed with respect to each other at a microlens array pitch, and wherein the light-emitting assembly includes an array of light-emitting elements disposed with respect to each other at a light-emitting element array pitch.

3. The optoelectronic module of claim 2, wherein the alignment distance is substantially equal to a non-zero whole number integer divided by two, the dividend being multiplied by the square of the microlens array pitch divided by the particular wavelength or range of wavelengths emitted by the light emitting assembly.

4. The optoelectronic module of claim 2, wherein the alignment distance is substantially equal to a non-zero whole number integer divided by two, the dividend being multiplied by the square of the light-emitting element array pitch divided by the particular wavelength or range of wavelengths emitted by the light emitting assembly.

5. The optoelectronic module as in claim 1, in which the light emitting element includes a laser diode.

6. The optoelectronic module of claim 5, wherein the laser diode is a vertical-cavity surface-emitting laser.

7. The optoelectronic module as in claim 1, in which the particular wavelength or range of wavelengths corresponds to the infrared portion of the electromagnetic spectrum.

8. The optoelectronic module as in claim 1, in which the optoelectronic module further includes a heat sink.

9. The optoelectronic module as in claim 1, in which the optoelectronic module further includes a lead frame.

10. The optoelectronic module of claim 1, in which the light-emitting assembly is mounted to a printed circuit board.

11. A thermally tunable optoelectronic module comprising:
    a light emitting assembly operable to emit light of a particular wavelength or range of wavelengths, the light emitting assembly being disposed to a temperature-dependent wavelength shift;
    an optical assembly aligned to the light emitting assembly, the optical assembly being separated from the light emitting assembly by an alignment distance; and
    a thermally tunable spacer disposed between the optical assembly and the light-emitting assembly, the thermally tunable spacer being operable to counteract the temperature-dependent wavelength shift in which the thermally tunable spacer is at least partially composed of a material having a negative thermal expansion coefficient;
    wherein the material having a negative thermal expansion coefficient is a liquid crystal polymer.

12. The optoelectronic module as in claim 11, the liquid crystal polymer being characterized by an orientation direction and a cross flow direction, the cross flow direction being substantially aligned with the alignment distance.

13. A thermally tunable optoelectronic module comprising:
    a light emitting assembly operable to emit light of a particular wavelength or range of wavelengths, the light emitting assembly being disposed to a temperature-dependent wavelength shift;
    an optical assembly aligned to the light emitting assembly, the optical assembly being separated from the light emitting assembly by an alignment distance; and
    a thermally tunable spacer disposed between the optical assembly and the light-emitting assembly, the thermally tunable spacer being operable to counteract the temperature-dependent wavelength shift in which the thermally tunable spacer is at least partially composed of a material having a negative thermal expansion coefficient;
    wherein the material having a negative thermal expansion coefficient is an inorganic oxide material.

14. The optoelectronic module as in claim 13, wherein the inorganic oxide is at least partially composed of $ZrW_2O_8$, $HfW_2O_8$, $ZrMo_2O_8$, $HfMo_2O_8$, $ZrV_2O_7 \cdot Zr_2(MoO_4)_3$, $ZrV_2O_7 \cdot Hf_2(MoO_4)_3$, $ZrV_2O_7 \cdot Zr_2(WO_4)_3$, $ZrV_2O_7 \cdot Hf_2(WO_4)_3$, or $CuScO_2$.

* * * * *